(12) United States Patent
Hayashi et al.

(10) Patent No.: US 12,360,186 B2
(45) Date of Patent: Jul. 15, 2025

(54) MRI APPARATUS AND AMPLIFYING APPARATUS

(71) Applicant: CANON MEDICAL SYSTEMS CORPORATION, Otawara (JP)

(72) Inventors: Kosuke Hayashi, Nasushiobara (JP); Mitsuyuki Murakami, Nasushiobara (JP); Aoi Sakamitsu, Utsunomiya (JP); Hirofumi Yamaki, Nasushiobara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 217 days.

(21) Appl. No.: 18/177,926

(22) Filed: Mar. 3, 2023

(65) Prior Publication Data

US 2023/0288506 A1    Sep. 14, 2023

(30) Foreign Application Priority Data

Mar. 9, 2022   (JP) .................................. 2022-036537
Mar. 1, 2023   (JP) .................................. 2023-031340

(51) Int. Cl.
  *G01R 33/36*    (2006.01)
  *G01R 33/34*    (2006.01)

(52) U.S. Cl.
  CPC ... *G01R 33/3614* (2013.01); *G01R 33/34076* (2013.01)

(58) Field of Classification Search
  CPC .......... G01R 33/3614; G01R 33/34076; G01R 33/3628; H03F 2200/451; H03F 1/0288
  See application file for complete search history.

(56) References Cited

U.S. PATENT DOCUMENTS

2016/0164553 A1*  6/2016  Kurihara .............. H04B 1/0475
                                                     375/297
2019/0049532 A1*  2/2019  Wang ..................... H03F 3/211
(Continued)

FOREIGN PATENT DOCUMENTS

EP       3 546 972 A1    10/2019
JP       2014-82749 A     5/2014
JP       2021-37158 A     3/2021

OTHER PUBLICATIONS

Extended European Search Report issued Jul. 10, 2023, in corresponding European Patent Application No. 23160925.6 citing documents 1, 2, 15, 16 and 24 therein, 12 pages.

(Continued)

*Primary Examiner* — G. M. A Hyder
(74) *Attorney, Agent, or Firm* — Oblon, McClelland, Maier & Neustadt, L.L.P.

(57) ABSTRACT

In one embodiment, an MRI apparatus includes: an RF coil configured to apply a radio frequency (RF) signal of a Larmor frequency of a spin species in an object; and an amplifying apparatus configured to amplify the RF signal and supply the amplified RF signal to an output that is connectable to a load (80) that includes at least the RF coil and the object, wherein: the amplifying apparatus includes two amplification circuits provided in parallel and an impedance transformation circuit; and the impedance transformation circuit is provided between the load and an output terminal of one of the two amplification circuits such that a polarity of reactance as viewed from an output terminal of one of the two amplification circuits toward the load is opposite to a polarity of reactance as viewed from an output terminal of another of the two amplification circuits toward the load.

7 Claims, 11 Drawing Sheets

(56) References Cited

U.S. PATENT DOCUMENTS

2019/0363683 A1 11/2019 Kamitani et al.
2021/0063513 A1 3/2021 Tanji et al.

OTHER PUBLICATIONS

Frederick H. Raab et al., "Power Amplifiers and Transmitters for RF and Microwave", IEEE Transactions on Microwave Theory and Techniques, IEEE, USA, vol. 50, No. 3, Mar. 1, 2002, XP011038657, ISSN: 0018-9480.

* cited by examiner

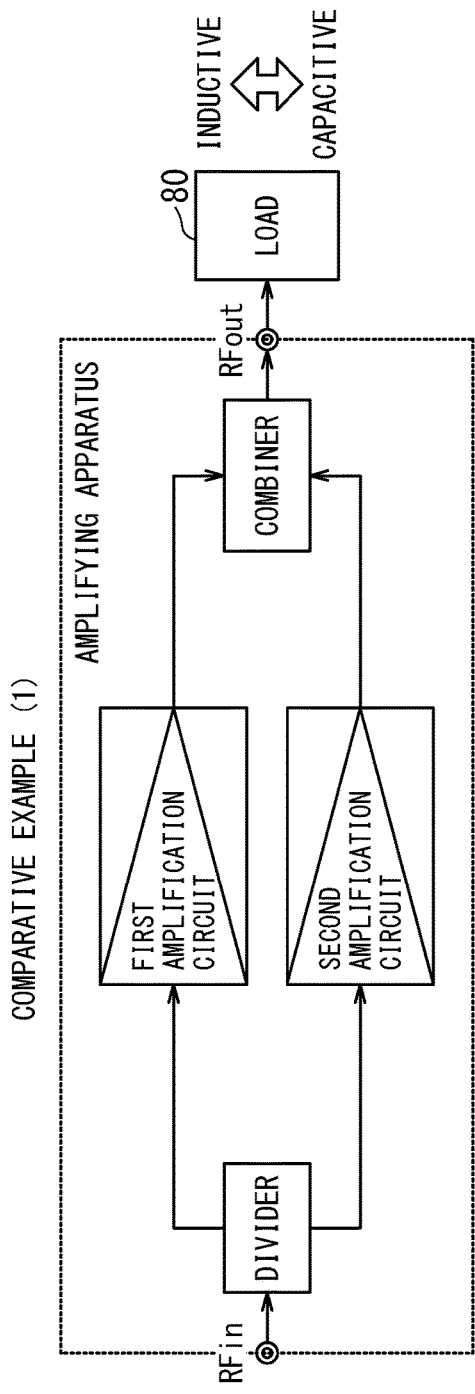
FIG. 4A
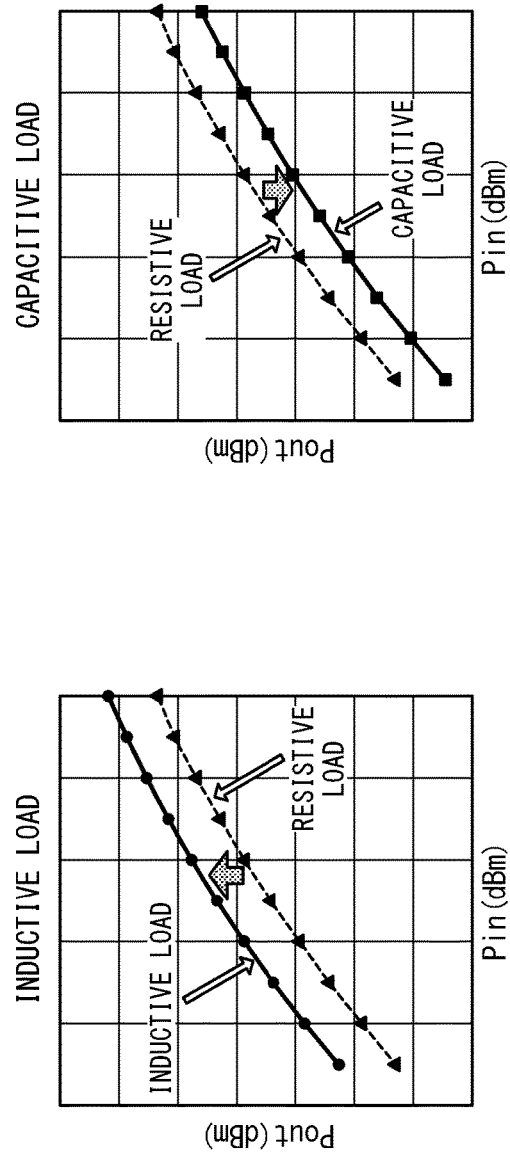
FIG. 4B
FIG. 4C

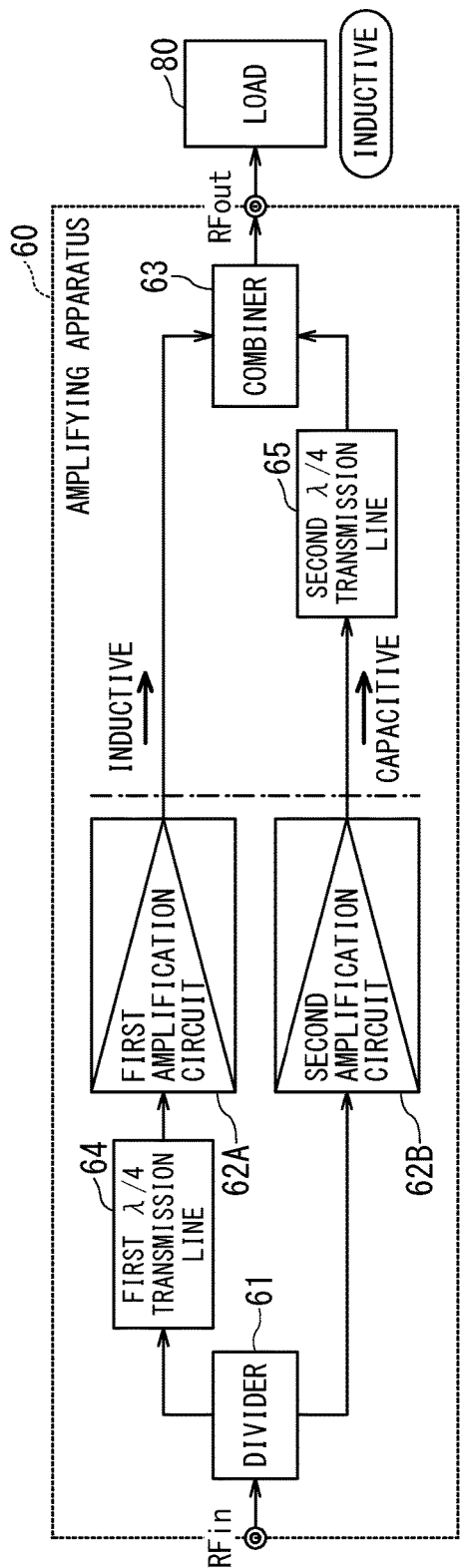
FIG. 6A
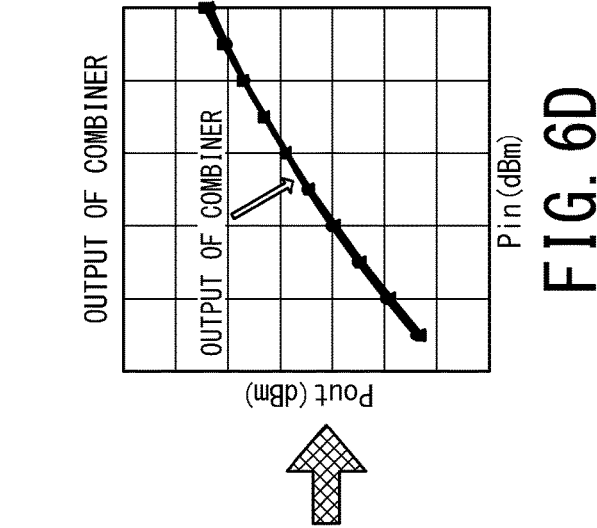
FIG. 6D
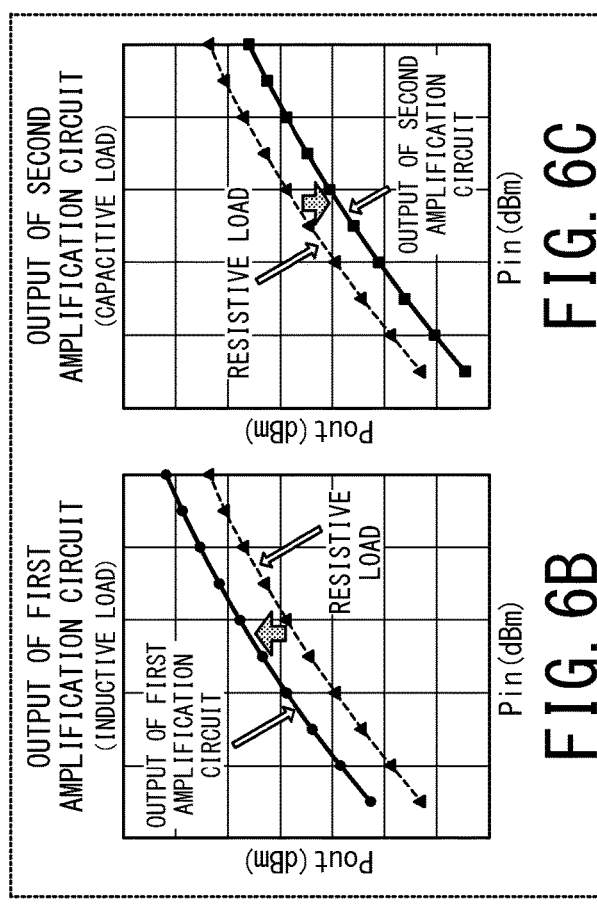
FIG. 6C
FIG. 6B

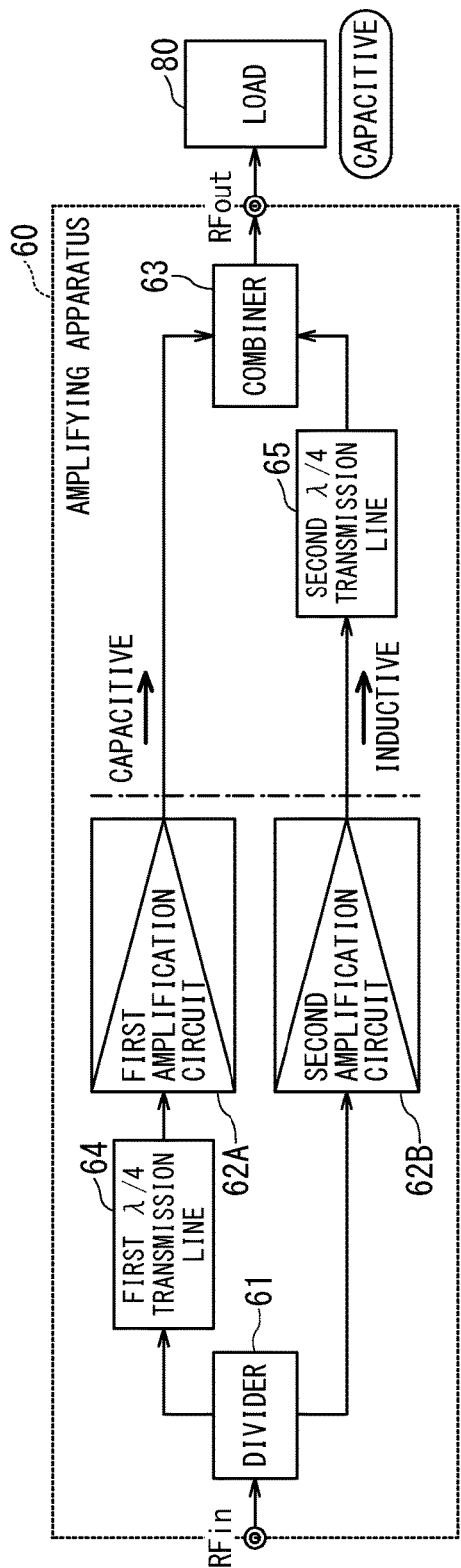
FIG. 7A
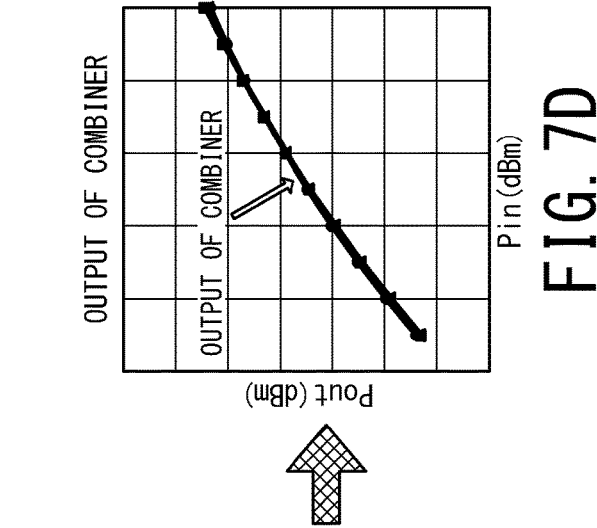
FIG. 7D
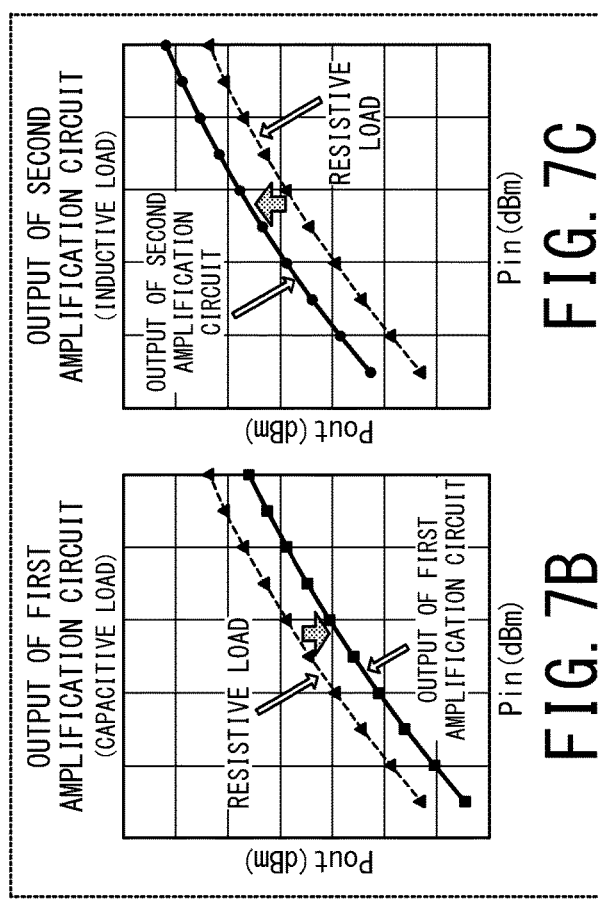
FIG. 7B
FIG. 7C

MRI APPARATUS AND AMPLIFYING APPARATUS

CROSS-REFERENCE TO RELATED APPLICATION

This application claims the benefit of priority of Japanese Patent Application No. 2022-036537, filed on Mar. 9, 2022, and No. 2023-031340, filed on Mar. 1, 2023, the entire contents of both of which are incorporated herein by reference.

TECHNICAL FIELD

Disclosed Embodiments relate to a magnetic resonance imaging (MRI) apparatus and an amplifying apparatus.

BACKGROUND

An MRI apparatus is an imaging apparatus that magnetically excites nuclear spin of an object placed in a static magnetic field with a radio frequency (RF) signal having the Larmor frequency and reconstructs an image based on the magnetic resonance (MR) signals emitted from the object due to the excitation.

Application of the RF signal to the object is performed by placing the object in a space surrounded by a cylindrical RF coil called a whole body (WB) coil; and applying a high-power RF signal amplified by an RF amplifier to the RF coil, for example.

In such an environment, the load of the RF amplifier includes not only the RF coil but also the object. In other words, the load of the RF amplifier changes due to factors excluding the RF coil, as exemplified by the physique and posture of the object placed inside the RF coil, the relative positional relationship of the object with respect to the RF coil, and the body motion of the object. For example, it is known that the load of the RF amplifier shows various changes due to the factors related to the object other than the RF coil, resulting in not only a resistive load but also an inductive load or a capacitive load.

Conventionally, a high-power isolator is provided between the output terminal of the RF amplifier and the RF coil in order to suppress the influence of the above-described load changes.

However, the high-power isolators is large in physical size and is expensive. In addition, the high-power isolator has a limit on its maximum output, which affects the output characteristics of the RF amplifier.

BRIEF DESCRIPTION OF THE DRAWINGS

In the accompanying drawings:

FIG. 4A is a block diagram illustrating a configuration of a conventional amplifying apparatus as Comparative Example 1;

FIG. 4B and FIG. 4C are schematic diagrams showing change in output characteristics of the amplification circuits in Comparative Example 1 for illustrating a conventional problem;

FIG. 6A to FIG. 6D are schematic diagrams illustrating operation and effects of the amplifying apparatus in the case of an inductive load;

FIG. 7A to FIG. 7D are schematic diagrams illustrating operation and effects of the amplifying apparatus in the case of a capacitive load;

DETAILED DESCRIPTION

Hereinbelow, a description will be given of MRI apparatuses and amplifying apparatuses according to embodiments of the present invention by referring to the accompanying drawings.

An MRI apparatus according to one embodiment includes: an RF coil configured to apply a radio frequency (RF) signal of a Larmor frequency of a spin species in an object; and an amplifying apparatus configured to amplify the RF signal and supply the amplified RF signal to an output that is connectable to a load (80) that includes at least the RF coil and the object, wherein: the amplifying apparatus includes two amplification circuits provided in parallel and an impedance transformation circuit; and the impedance transformation circuit is provided between the load and an output terminal of one of the two amplification circuits such that a polarity of reactance as viewed from an output terminal of one of the two amplification circuits toward the load is opposite to a polarity of reactance as viewed from an output terminal of the other of the two amplification circuits toward the load.

Figure 1:
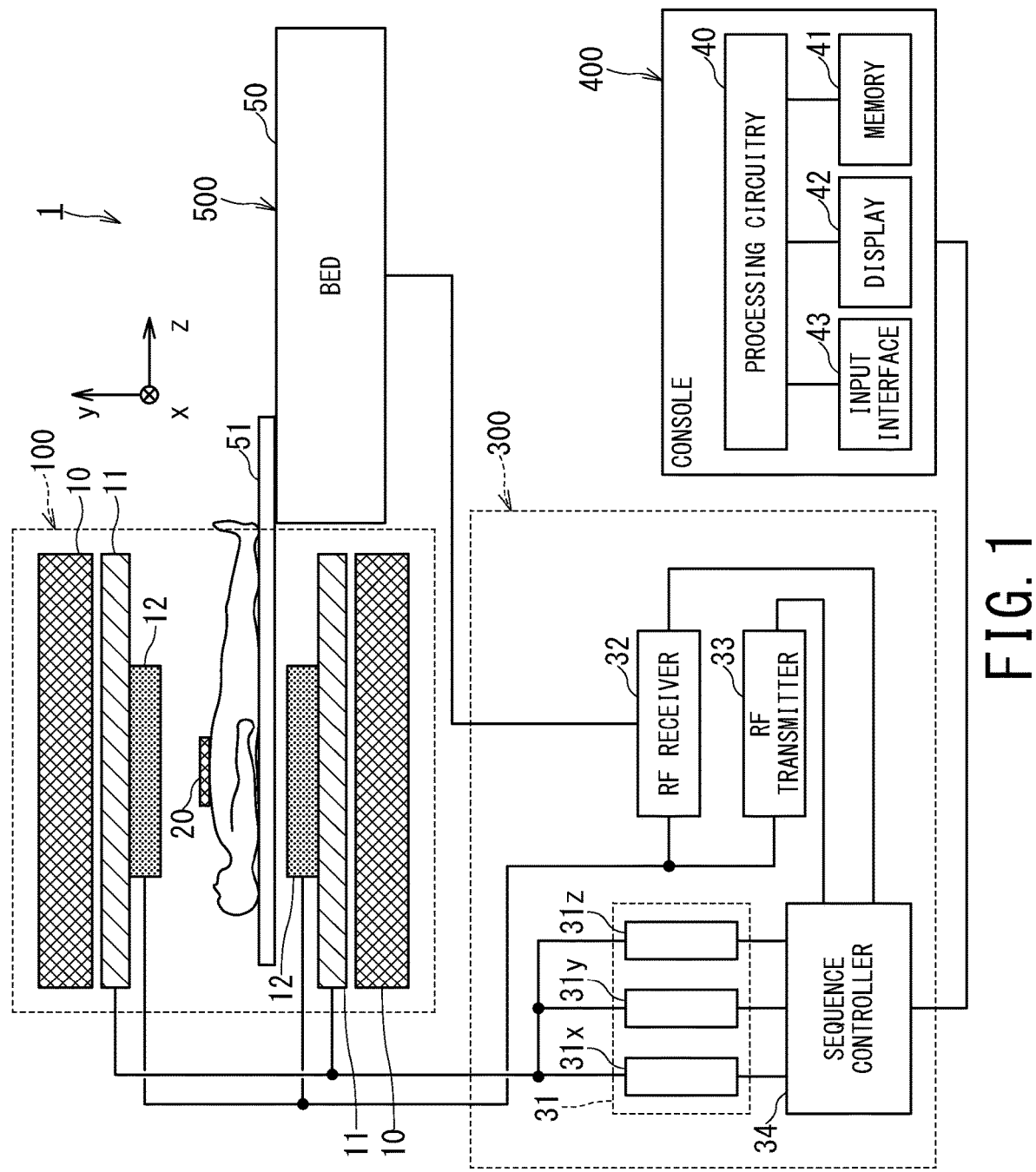
FIG. 1 is a configuration diagram illustrating an overall configuration of an MRI apparatus according to the first embodiment.

(MRI Apparatus) FIG. 1 is a block diagram illustrating an overall configuration of an MRI apparatus 1 according to the present embodiment. The MRI apparatus 1 according to the present embodiment includes a gantry 100, a control cabinet 300, a console 400, and a bed 500, for example.

The gantry 100 includes a static magnetic field magnet 10, a gradient coil 11, and an RF coil 12, and these components are housed in a cylindrical housing. The bed 500 includes a bed body 50 and a table 51. The MRI apparatus 1 includes at least one local RF coil 20 (i.e., surface coil or local coil) to be disposed close to an object.

The control cabinet 300 includes: three gradient coil power supplies 31 (31x for an X-axis, 31y for a Y-axis, and 31z for a Z-axis); an RF receiver 32; an RF transmitter 33; and a sequence controller 34.

The static magnetic field magnet 10 of the gantry 100 is substantially in the form of a cylinder and generates a static magnetic field inside a bore, which is a space inside the cylindrical structure of the static magnetic field magnet 10 and is also an imaging region of an object such as a patient. The static magnetic field magnet 10 includes a superconducting coil inside, and the superconducting coil is cooled down to an extremely low temperature by liquid helium. The static magnetic field magnet 10 generates a static magnetic field by supplying the superconducting coil with an electric current provided from a static magnetic field power supply (not shown) in an excitation mode. Afterward, the static magnetic field magnet 10 shifts to a permanent current mode, and the static magnetic field power supply is separated. Once it enters the permanent current mode, the static magnetic field magnet 10 continues to generate a strong static magnetic field for a long time, for example, over one year. Note that the static magnetic field magnet 10 may be configured as a permanent magnet.

The gradient coil 11 is also substantially in the form of a cylinder and is fixed to the inside of the static magnetic field magnet 10. This gradient coil 11 applies gradient magnetic fields to the object in the respective directions of the X-axis, the Y-axis, and the Z-axis by using electric currents supplied from the gradient coil power supplies 31$x$, 31$y$, and 31$z$.

The bed body 50 of the bed 500 can move the table 51 in the vertical direction, and moves the table 51 with the object placed thereon to a predetermined height before imaging. Afterward, when the object is imaged, the bed body 50 moves the table 51 in the horizontal direction so as to move the object to the inside of the bore.

The RF coil 12 is also called a whole body (WB) coil or a birdcage coil. The RF coil 12 is shaped substantially in the form of a cylinder to surround the object and is fixed to the inside of the gradient coil 11. The RF coil 12 applies RF pulses transmitted from the RF transmitter 33 to the object, and receives MR signals emitted from the object due to excitation of hydrogen nuclei.

The local coil 20 receives MR signals emitted from the object at a position close to the body surface of the object. The local coil 20 includes a plurality of coil elements, for example. There are various types of local coils 20 for different anatomical imaging part of the object, such as the head, the chest, the spine, the lower limbs, and the whole body. FIG. 1 illustrates the local coil 20 for the chest.

The RF transmitter 33 transmits each RF pulse to the RF coil 12 based on an instruction from the sequence controller 34. The RF transmitter 33 includes an amplifying apparatus as described below. The RF receiver 32 receives MR signals detected by the RF coil 12 and/or the local coil 20, digitizes the detected MR signals to acquire raw data, and transmits the acquired raw data to the sequence controller 34.

The sequence controller 34 performs a scan of the object by driving the gradient coil power supplies 31, the RF transmitter 33, and the RF receiver 32 under the control of the console 400. The sequence controller 34 receives MR signals acquired by the scan from the RF receiver 32, and transmits the received MR signals to the console 400.

The sequence controller 34 includes processing circuitry (not shown). This processing circuitry is configured as a processor that executes predetermined programs or is configured as hardware such as a field programmable gate array (FPGA) and an application specific integrated circuit (ASIC), for example.

The console 400 is configured as a computer that includes processing circuitry 40, a memory 41, a display 42, and an input interface 43.

The memory 41 is a recording medium including a read-only memory (ROM) and/or a random access memory (PAM) in addition to an external memory device such as a hard disk drive (HDD) and an optical disc device. The memory 41 stores various programs to be executed by the processor of the processing circuitry 40 as well as various data and information.

The input interface 43 includes various devices for an operator to input various data and information, and is configured of a mouse, a keyboard, a trackball, and/or a touch panel, for example.

The display 42 is a display device such as a liquid crystal display panel, a plasma display panel, and an organic EL panel.

The processing circuitry 40 is a circuit provided with a central processing unit (CPU) and/or a special-purpose or general-purpose processor, for example. The processor implements various functions described below by executing the programs stored in the memory 41. The processing circuitry 40 may be configured of hardware such as an FPGA and an ASIC. The various functions described below can also be implemented by such hardware. Additionally, the processing circuitry 40 can implement the various functions by combining hardware processing and software processing based on its processor and programs.

The console 400 controls the entirety of the MRI apparatus 1 by using these components. Specifically, the console 400 receives various information and instructions including imaging conditions through the input interface 43 including a mouse and/or a keyboard that are operated by an operator such as a medical imaging technologist. The processing circuitry 40 causes the sequence controller 34 to perform a scan on the basis of the inputted imaging conditions, and reconstructs an image on the basis of the raw data transmitted from the sequence controller 34. The reconstructed image is displayed on the display 42 or stored in the memory 41.

First Embodiment of Amplifying Apparatus

Figure 2:
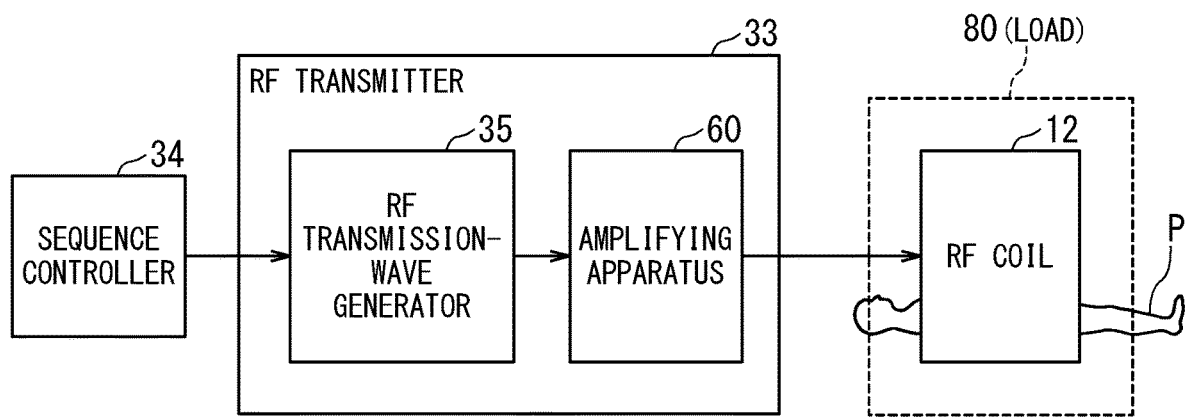
FIG. 2 is a block diagram illustrating relationship between an amplifying apparatus and the MRI apparatus according to the first embodiment.

FIG. 2 is a block diagram illustrating relationship between the MRI apparatus 1 and an amplifying apparatus 60 of the first embodiment. As described above, the RF transmitter 33 outputs RF pulses to the RF coil 12 based on an instruction from the sequence controller 34.

As shown in FIG. 2, the RF transmitter 33 includes at least an RF transmission-wave generator 35 and the amplifying apparatus 60. Based on various parameters of a pulse sequence instructed by the RF transmission-wave generator 35, an RF pulse train in the Larmor frequency band is generated as an RF transmission wave.

The amplifying apparatus 60 amplifies the generated RF transmission wave to a predetermined high power and outputs the amplified RF transmission wave to the RF coil 12. The RF coil 12 is, for example, a cylindrical WB coil. In the internal space of the RF coil 12, an object P to be imaged is placed. Thus, a load 80 of the amplifying apparatus 60 includes not only the RF coil 12 but also the object P. Hence, even when load matching is satisfactorily achieved between the RF coil 12 and the amplifying apparatus 60, the effective load changes due to the object P placed in the internal space of the RF coil 12, and consequently, load mismatch may occur.

The effective load can change depending on factors related to the object P, such as the physique and posture of the object P, the relative positional relationship between the object and the RF coil 12, and the body motion of the object. Thus, the load of the amplifying apparatus 60 may include a reactance component in addition to resistive load component (for example, 50 ohm). In this case, the magnitude and polarity of the reactance component also change due to the factors related to object P. When the reactance component has a positive polarity, the load of the amplifying apparatus 60 may become an inductive load. When the reactance component has a negative polarity, the load of the amplifying apparatus 60 may become a capacitive load.

Figure 3:
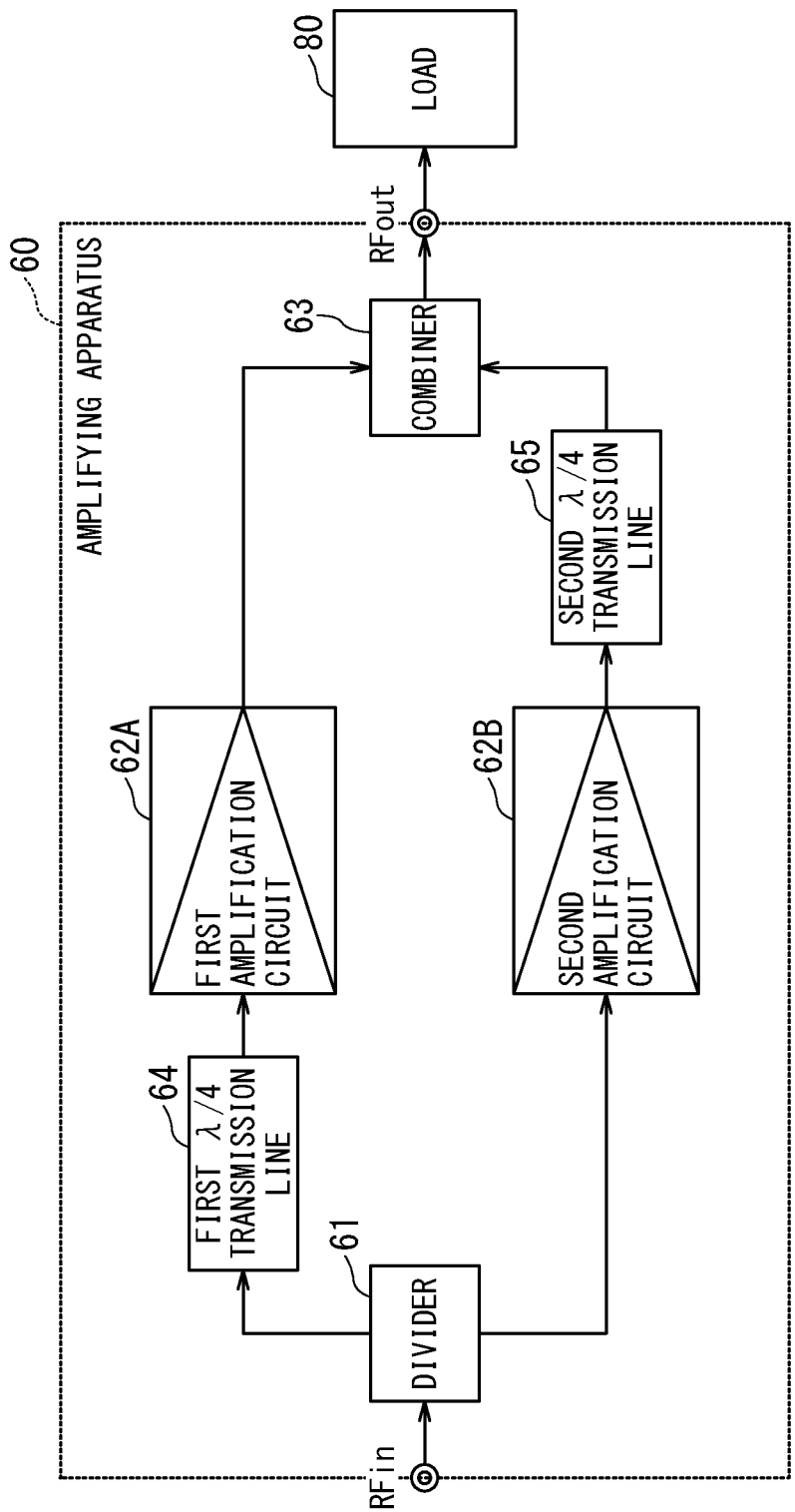
FIG. 3 is a block diagram illustrating a configuration of the amplifying apparatus according to the first embodiment.

FIG. 3 is a block diagram illustrating a configuration of the amplifying apparatus 60 according to the first embodiment. The amplifying apparatus 60 includes: a divider 61; a first quarter-wavelength transmission line 64 (hereinafter referred to as the first λ/4 transmission line 64); a first amplification circuit 62A; a second amplification circuit 62B; a second quarter-wavelength transmission line 65 (hereinafter referred to as the second λ/4 transmission line 65); and a combiner 63.

The divider 61 divides an input signal RF in outputted from the RF transmission-wave generator 35 into a first input signal and a second input signal. The first amplification circuit 62A amplifies the first input signal. The first λ/4 transmission line 64 is provided between the divider 61 and the input terminal of the first amplification circuit 62A.

The second amplification circuit 62B amplifies the second input signal. The combiner 63 combines the first output signal outputted from the first amplification circuit 62A and the second output signal outputted from the second amplification circuit 62B, and outputs the combined signal to the load 80. The second λ/4 transmission line 65 is provided between the combiner 63 and the output terminal of the second amplification circuit 62B. As described below, the second λ/4 transmission line 65 functions as an impedance transformation circuit.

The input signal is divided by the divider 61 into two signals, then is individually amplified by the first amplification circuit 62A and the second amplification circuit 62B, and then is combined into one signal. This configuration enables such a high-power RF signal to be supplied to the load 80 that cannot be obtained by one amplification circuit.

The first λ/4 transmission line 64 and the second λ/4 transmission line 65 are provided for suppressing the influence of the load change, and are characteristic configurations of the amplifying apparatus 60 in the present embodiment.

Prior to description of the operation and effects of the amplifying apparatus 60 configured as described above, a description will be given of conventional amplifying apparatuses and their problems by referring to FIG. 4A to FIG. 5.

FIG. 4A is a block diagram illustrating a configuration of a conventional amplifying apparatus as Comparative Example 1. As can be seen by comparing FIG. 4A with FIG. 3, the amplifying apparatus of Comparative Example 1 does not include the first λ/4 transmission line 64 and the second λ/4 transmission line 65.

In the MRI apparatus 1, depending on the factors related to the object to be imaged as described above, the load of the amplifying apparatus can change into not only a resistive load but also an inductive load or a capacitive load. Such load change generates load mismatch, generating a reflected signal from the load toward the output terminal of each amplification circuit.

It is known that output characteristics of an amplification circuit change due to influence of the load mismatch or the reflected signal. In particular, it is known that output characteristics of an amplification circuit change depending on whether the impedance as viewed from the output terminal of the amplification circuit toward the load is inductive or capacitive.

FIG. 4B and FIG. 4C are schematic graphs of change in output characteristics of the amplification circuits of Comparative Example 1 caused by the load mismatch. FIG. 4B is a schematic diagram illustrating input/output characteristics of the amplification circuits when the load 80 is inductive. When the load 80 is inductive, the gain of the amplification circuits tends to increase as compared with the case where the load 80 is a resistive load.

FIG. 4C is a schematic diagram illustrating the input/output characteristics of the amplification circuits when the load 80 is capacitive. When the load 80 is capacitive, the gain of the amplification circuits tends to decrease as compared with the case where the load 80 is a resistive load. As described above, the direction of change in gain of the amplification circuit (i.e., whether it increases or decreases) is known to be reversed depending on whether the load 80 is inductive or capacitive.

When the gain of the amplification circuit or the output power of the amplification circuit changes due to the change of the load 80 in this manner, it is inconvenient that power of an intended value cannot be supplied to the load 80.

Figure 5:
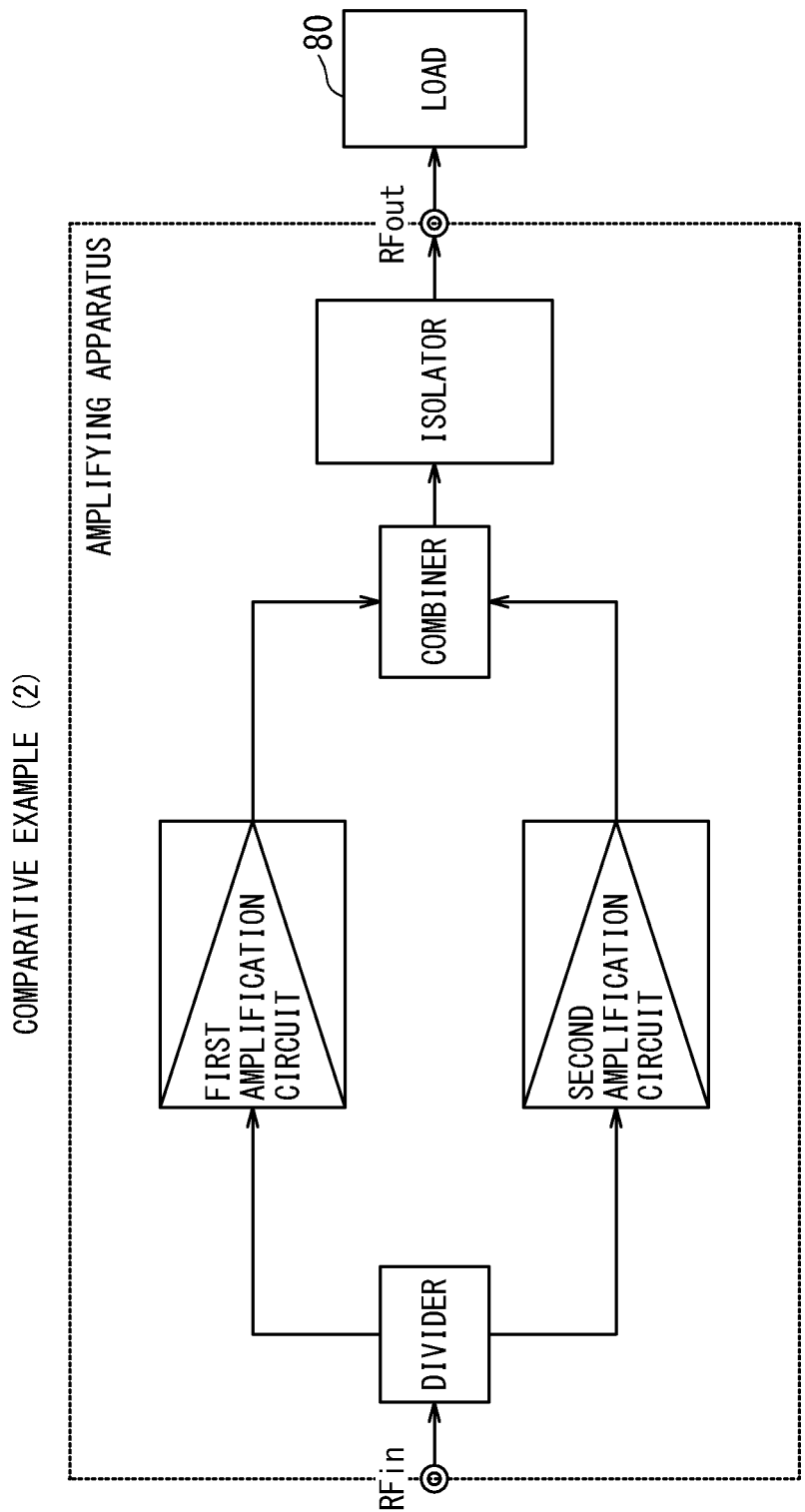
FIG. 5 is a block diagram showing a configuration of a conventional amplifying apparatus as Comparative Example 2 for illustrating another conventional problem.

FIG. 5 is a block diagram of a configuration of another conventional amplifying apparatus, i.e., Comparative Example 2 in which an isolator is provided between the load 80 and the combiner in order to avoid the above-described inconvenience. In Comparative Example 2, even if the load 80 changes and the load mismatch occurs, the reflected signal is absorbed by the isolator, so the reflected signal does not reach the output terminal of each amplification circuit. Thus, the above-described inconvenience does not occur.

However, as described above, the high-power isolator is large in physical size and is expensive. Further, the high-power isolator has a limit on its maximum output, which may affect the output characteristics of the amplification circuit.

Thus, in the amplifying apparatus 60 of the present embodiment, the first λ/4 transmission line 64 and the second λ/4 transmission line 65 are provided, and this configuration enables suppression of the influence of the load change without a high-power isolator. Hereinafter, the operation and effects of this configuration will be described by referring to FIG. 6A to FIG. 7D.

FIG. 6A to FIG. 6D are schematic diagrams illustrating the operation and effects of the amplifying apparatus 60 when the load 80 is inductive. The configuration of the amplifying apparatus 60 shown in FIG. 6A is the same as the configuration shown in FIG. 3. When the load 80 is inductive, the impedance as viewed from the output terminal of the first amplification circuit 62A toward the load 80 is substantially the same as the impedance of the load 80 and is inductive.

FIG. 6B is a schematic diagram illustrating the input/output characteristics of the first amplification circuit 62A. When the impedance as viewed from the output terminal of the first amplification circuit 62A toward the load 80 is inductive, the gain of the first amplification circuit 62A tends to increase as compared with the case where the load 80 is resistive.

Meanwhile, the second λ/4 transmission line 65 is provided between the combiner 63 and the output terminal of the second amplification circuit 62B. Note that the second λ/4 transmission line 65 functions as an impedance transformation circuit. In other words, the second λ/4 transmission line 65 has a function of causing the impedance as viewed from a first point between the combiner 63 and the second λ/4 transmission line 65 toward the load 80 to become different from the impedance as viewed from a second point between the second λ/4 transmission line 65 and the second amplification circuit 62B toward the load 80. More specifically, by providing the second λ/4 transmission line 65 between the combiner 63 and the second amplification circuit 62B, the polarity of the reactance component of the impedance as viewed from the output terminal of the second amplification circuit 62B toward the load 80 can be made to be opposite to the polarity of the reactance component of the impedance as viewed from the output terminal of the first amplification circuit 62A toward the load 80.

In other words, the second λ/4 transmission line 65 has an effect of producing a phase difference of 180° between (a) the impedance as viewed from the output terminal of the second amplification circuit 62B toward the load 80 and (b) the impedance as viewed from the output terminal of the first amplification circuit 62A toward the load 80.

Thus, when the load 80 is inductive (i.e., the polarity of the reactance component of the load 80 is positive), the impedance as viewed from the output terminal of the second amplification circuit 62B toward the load 80 becomes capacitive (i.e., the polarity of the reactance component of the load 80 becomes negative).

FIG. 6C is a schematic diagram illustrating the input/output characteristics of the second amplification circuit 62B. When the impedance as viewed from the output terminal of the second amplification circuit 62B toward the load 80 is capacitive, the gain of the second amplification circuit 62B tends to decrease with respect to the case where the load 80 is resistive.

FIG. 6D is a schematic diagram illustrating the characteristics of the combined output of the respective outputs of the first amplification circuit 62A and the second amplification circuit 62B (i.e., output of the combiner 63). In the output of the combiner 63, decrease in gain of the second amplification circuit 62B is complemented by increase in gain of the first amplification circuit 62A. As a result, the amplifying apparatus 60 behaves in almost the same manner as in the case of supplying power to a resistive load.

Note that the first λ/4 transmission line 64 provided between the divider 61 and the first amplification circuit 62A is a phase adjusting circuit for making the two RF signals divided by the divider 61 have the same phase at the two input terminals of the combiner 63.

FIG. 7A to FIG. 7D are schematic diagrams illustrating the operation and effects of the amplifying apparatus 60 when the load 80 is capacitive. When the load 80 is capacitive, the impedance as viewed from the output terminal of the first amplification circuit 62A toward the load 80 is substantially the same as the impedance of the load 80 and is capacitive.

FIG. 7B is a schematic diagram illustrating the input/output characteristics of the first amplification circuit 62A. When the impedance as viewed from the output terminal of the first amplification circuit 62A toward the load 80 is capacitive, the gain of the first amplification circuit 62A tends to decrease with respect to the case where the load 80 is resistive, contrary to the case of FIG. 6B.

The second λ/4 transmission line 65 is provided as an impedance transformation circuit between the combiner 63 and the output terminal of the second amplification circuit 62B. Thus, when the load 80 is capacitive (i.e., the reactance component of the load 80 has a negative polarity), the impedance as viewed from the output terminal of the second amplification circuit 62B toward the load 80 is inductive (i.e., the reactance component of the load 80 has a negative polarity).

FIG. 7C is a schematic diagram illustrating the input/output characteristics of the second amplification circuit 62B. When the impedance as viewed from the output terminal of the second amplification circuit 62B toward the load 80 is inductive, the gain of the second amplification circuit 62B tends to increase with respect to the case where the load 80 is resistive.

FIG. 7D is a schematic diagram illustrating the characteristics of the combined output of the respective outputs of the first amplification circuit 62A and the second amplification circuit 62B (i.e., output of the combiner 63). In the output of the combiner 63, decrease in gain of the first amplification circuit 62A is complemented by increase in gain of the second amplification circuit 62B. As a result, the amplifying apparatus 60 behaves in almost the same manner as in the case of supplying power to a resistive load.

In the amplifying apparatus 60 of the first embodiment as described above, the second λ/4 transmission line 65 is provided as an impedance transformation circuit between the combiner 63 and the second amplification circuit 62B. Hence, regardless of whether the load 80 changes into an inductive load or a capacitive load, the amplifying apparatus 60 can behave in almost the same manner as in the case where the load 80 is a resistive load, thereby the gain change of the amplifying apparatus 60 can be suppressed, and consequently, stable input/output characteristics can be available.

Modification

Figure 8:
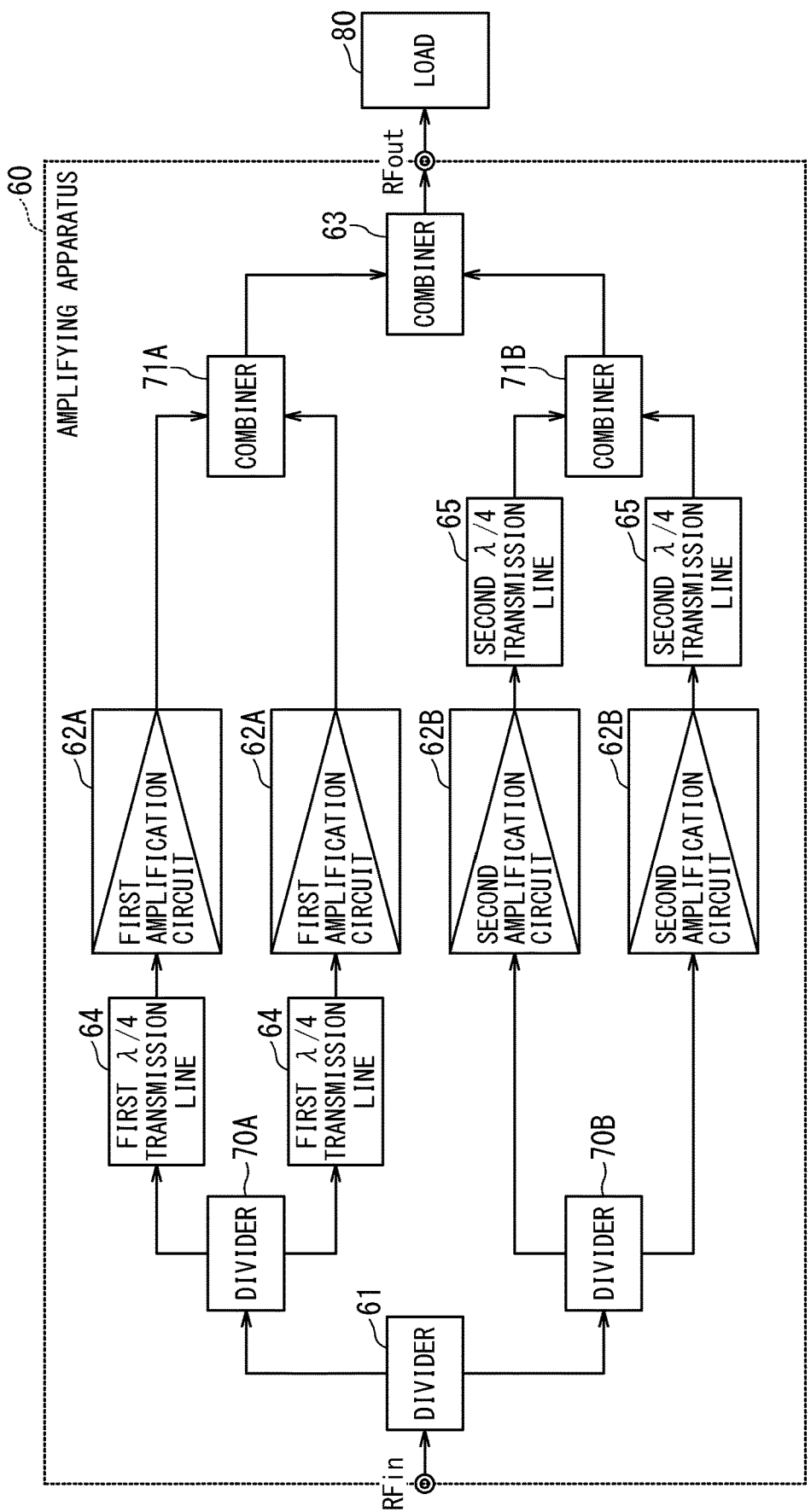
FIG. 8 is a block diagram illustrating a configuration of an amplifying apparatus according to a modification of the first embodiment.

FIG. 8 is a block diagram illustrating a configuration of the amplifying apparatus 60 according to a modification of the first embodiment. In this modification, as shown in FIG. 8, a plurality of (for example, two) first amplification circuits 62A and a plurality of (for example, two) second amplification circuits 62B are provided. With such a configuration, the output power of the amplifying apparatus 60 can be increased while maintaining the effects of the first embodiment described above.

Note that the number of the first amplification circuits 62A and the number of the second amplification circuits 62B are not limited to the configuration of FIG. 8. For example, the number of the second amplification circuit 62B may be reduced to one while maintaining the number of the first amplification circuits 62A at two. Additionally, both the number of the first amplification circuits 62A and the number of the second amplification circuits 62B may be three or more.

Second Embodiment of Amplifying Apparatus

Figure 9:
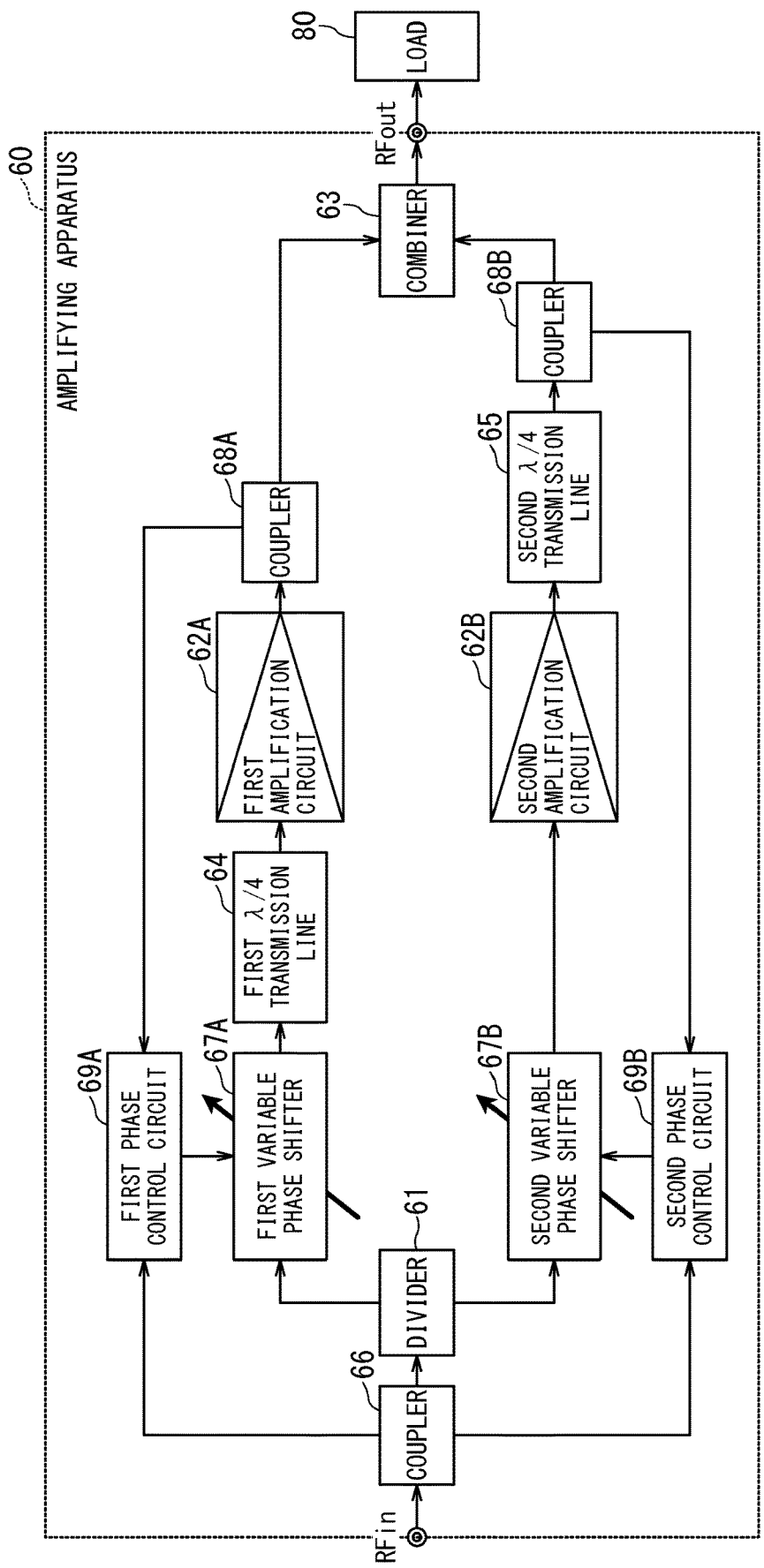
FIG. 9 is a block diagram illustrating a configuration of an amplifying apparatus according to the second embodiment.

FIG. 9 is a block diagram illustrating a configuration of the amplifying apparatus 60 according to the second embodiment. The amplifying apparatus 60 according to the second embodiment includes at least a first variable phase shifter 67A, a second variable phase shifter 67B; and a phase control circuit, in addition to the configuration of the first embodiment. The phase control circuit includes a first phase control circuit 69A, a second phase control circuit 69B, a coupler 66, a coupler 68A, and a coupler 68B, for example.

The first variable phase shifter 67A is provided between the divider 61 and the first amplification circuit 62A, and adjusts the phase of the RF signal on the path from the divider 61 to the combiner 63 via the first amplification circuit 62A. On the other hand, the second variable phase shifter 67B is provided between the divider 61 and the second amplification circuit 62B, and adjusts the phase of the RF signal on the path from the divider 61 to the combiner 63 via the second amplification circuit 62B.

Of the two input terminals of the combiner 63, the first input terminal receives the first output signal of the first amplification circuit 62A, and the second input terminal receives the second output signal of the second amplification circuit 62B. When defining the phase of the first output signal at the first input terminal of the combiner 63 as the first phase, and the phase of the second output signal at the second input terminal of the combiner 63 as the second phase, the phase control circuit performs feedback control on the first variable phase shifter 67A and the second variable phase shifter 67B such that the first phase and the second phase become same.

More specifically, each of the first phase control circuit 69A and the second phase control circuit 69B in the phase control circuit includes a phase detector. By controlling the phase shift amount of each of the first variable phase shifter 67A and the second variable phase shifter 67B in such a manner that the phases detected by the respective phase detectors become same, the phases of the respective two RF signals inputted to the combiner 63 become same.

Even if the phase shift amount of each of the first amplification circuit 62A and the second amplification circuit 62B is changed due to factors such as heat, such phase control allows two phases of the respective two RF signals inputted to the combiner 63 to be the same, and thus, the combined output can be maintained at the maximum value.

Third Embodiment of Amplifying Apparatus

Figure 10:
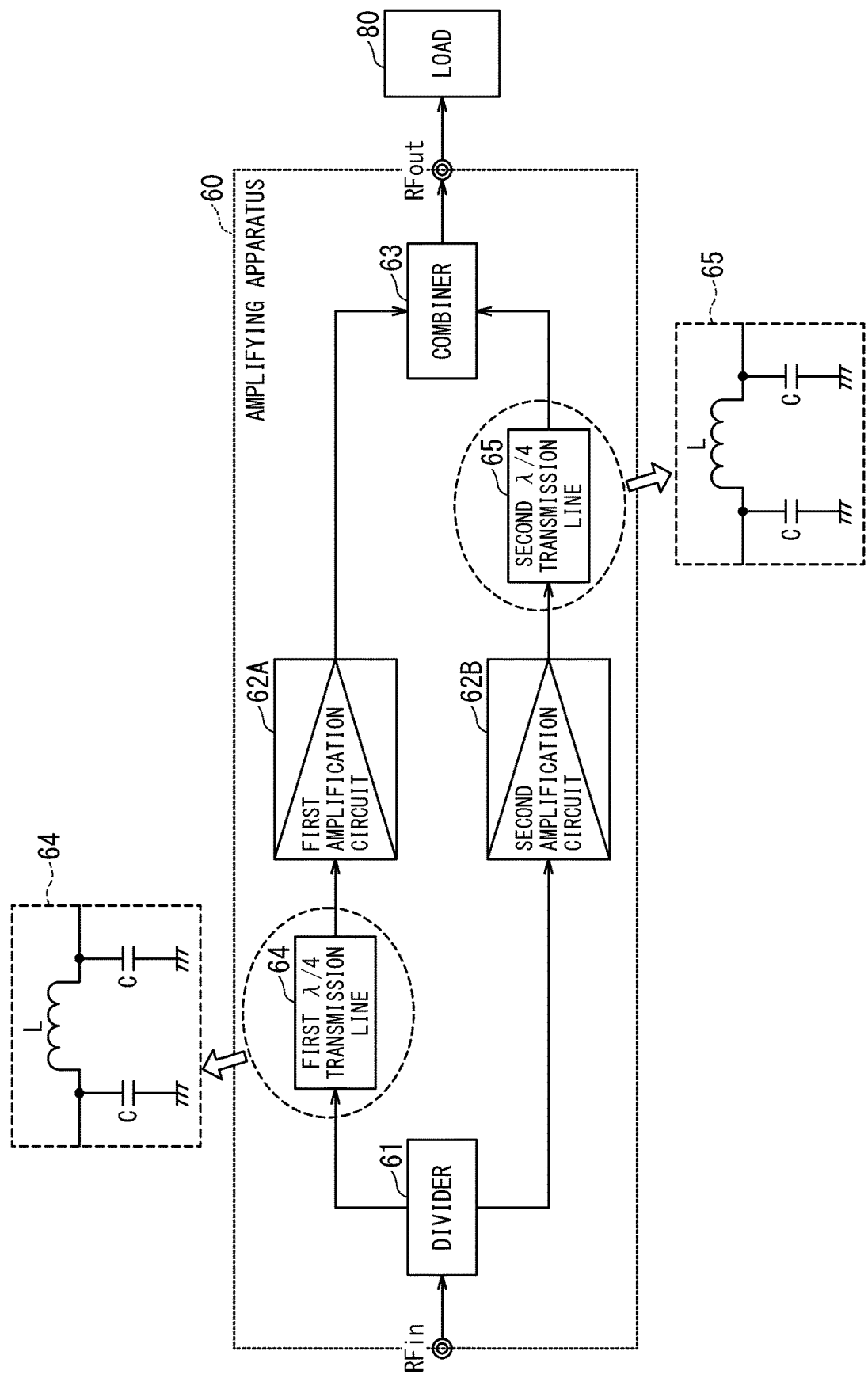
FIG. 10 is a block diagram illustrating a configuration of an amplifying apparatus according to the third embodiment.

FIG. 10 is a block diagram illustrating a configuration of the amplifying apparatus 60 according to the third embodiment. In the first and second embodiments, each of the first $\lambda/4$ transmission line 64 and the second $\lambda/4$ transmission line 65 is composed of a transmission line with a length equivalent to ¼ wavelength. In the third embodiment, the first $\lambda/4$ transmission line 64 and the second $\lambda/4$ transmission line 65 are replaced by LC circuits 64 and 65, each of which includes a capacitor C and an inductor L as shown in FIG. 10.

Such LC circuits 64 and 65 can also achieve a phase shift of ¼ wavelength (i.e., 90°) and obtain the same effects as the case of using the first $\lambda/4$ transmission line 64 and the second $\lambda/4$ transmission line 65.

FIG. 11A to FIG. 11D are circuit diagrams illustrating modifications of the above-described LC circuits 64 and 65.

Figure 11A:
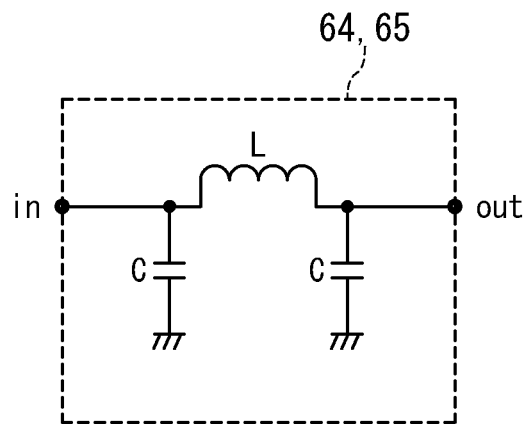
FIG. 11A to FIG. 11D are circuit diagrams, each of which illustrates a modification of an LC circuit to be used as a λ/4 transmission line.

FIG. 11A shows a π-type (C-L-C) LC circuit 64 or 65 in which an inductor L is arranged between two capacitors C, and is the same as the circuit shown in FIG. 10.

Figure 11B:
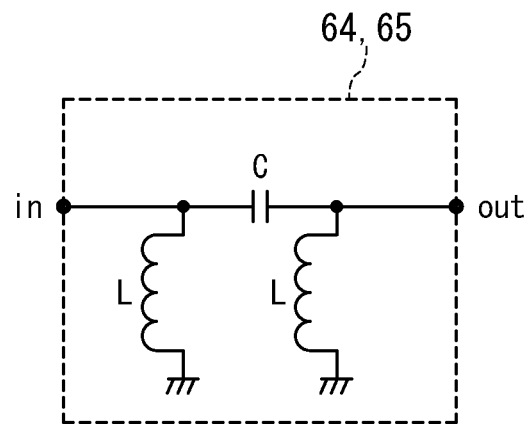
Figure 11C:
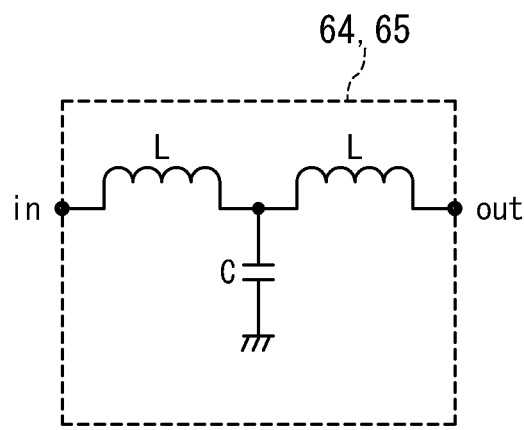
Figure 11D:
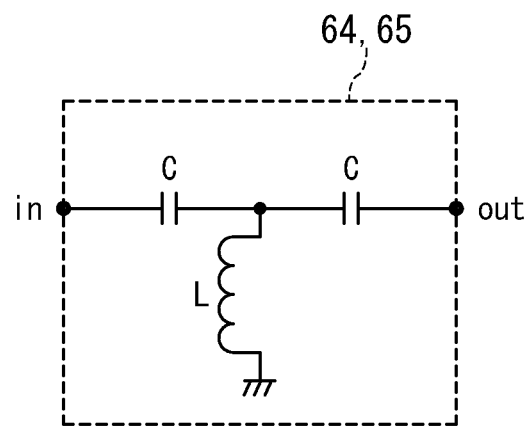

FIG. 11B shows a π-type (L-C-L) LC circuit 64 or 65. FIG. 11C shows a T-type (L-C-L) LC circuit 64 or 65. FIG. 11D shows a T-type (C-L-C) LC circuit 64 or 65. These LC circuits 64 and 65 can also provide the same effect as the first $\lambda/4$ transmission line 64 and the second $\lambda/4$ transmission line 65.

As described above, the MRI apparatus of each embodiment can suppress the influence of the load change without providing a high-power isolator between the RF amplifier and the RF coil in the MRI apparatus.

While certain embodiments have been described, these embodiments have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the scope of the invention as defined by the appended claims.

What is claimed is:
1. An MRI apparatus comprising:
an RF coil configured to apply a radio frequency (RF) signal of a Larmor frequency of a spin species in an object; and
an amplifying apparatus configured to amplify the RF signal and supply the amplified RF signal to an output that is connectable to a load that includes at least the RF coil and the object, wherein:
the amplifying apparatus includes two amplification circuits provided in parallel and an impedance transformation circuit; and
the impedance transformation circuit is provided between the load and an output terminal of one of the two amplification circuits in such a manner that a polarity of reactance as viewed from an output terminal of one of the two amplification circuits toward the load is opposite to a polarity of reactance as viewed from an output terminal of another of the two amplification circuits toward the load.
2. The MRI apparatus according to claim 1, wherein:
the amplifying apparatus comprises
a divider configured to divide an input signal into a first input signal and a second input signal,
at least one first amplification circuit configured to amplify the first input signal,
at least one second amplification circuit configured to amplify the second input signal, and
a combiner configured to combine a first output signal outputted from the at least one first amplification circuit and a second output signal outputted from the at least one second amplification circuit and to supply the RF coil with a combined signal as the RF signal;
a first quarter-wavelength transmission line is provided between the divider and an input terminal of the at least one first amplification circuit; and
a second quarter-wavelength transmission line is provided as the impedance transformation circuit between the combiner and an output terminal of the at least one second amplification circuit.
3. The MRI apparatus according to claim 2, wherein:
when the load is inductive, the load as viewed from an output terminal of the at least one first amplification circuit is inductive, whereas the load as viewed from an output terminal of the at least one second amplification circuit is capacitive; and
when the load is capacitive, the load as viewed from the output terminal of the at least one first amplification circuit is capacitive, whereas the load as viewed from the output terminal of the at least one second amplification circuit is inductive.
4. The MRI apparatus according to claim 2, wherein the second quarter-wavelength transmission line produces a phase difference of 180° between impedance as viewed from an output terminal of the at least one second amplification circuit toward the load and impedance as viewed from an output terminal of the at least one first amplification circuit toward the load.
5. The MRI apparatus according to claim 2, wherein:
(a) the at least one first amplification circuit comprises a plurality of first amplification circuits; and/or
(b) the at least one second amplification circuit comprises a plurality of second amplification circuits.

6. The MRI apparatus according to claim 2, further comprising:
- a first variable phase shifter provided between the divider and the at least one first amplification circuit;
- a second variable phase shifter provided between the divider and the at least one second amplification circuit; and
- a phase control circuit configured to perform feedback control on the first variable phase shifter and the second variable phase shifter in such a manner that a first phase at a first input terminal of the combiner becomes same as a second phase at a second input terminal of the combiner,
    - the first input terminal being a terminal to which the first output signal is inputted,
    - the second input terminal being a terminal to which the second output signal is inputted.

7. An amplifying apparatus that amplifies a radio frequency (RF) signal of a Larmor frequency of a spin species in an object, and supplies the amplified RF signal to an output that is connectable to a load that includes at least an RF coil and the object, the amplifying apparatus comprising:
- two amplification circuits provided in parallel; and
- an impedance transformation circuit,
- wherein the impedance transformation circuit is provided between the load and an output terminal of one of the two amplification circuits in such a manner that a polarity of reactance as viewed from an output terminal of one of the two amplification circuits toward the load is opposite to a polarity of reactance as viewed from an output terminal of another of the two amplification circuits toward the load.

* * * * *